United States Patent [19]

Yoshida et al.

[11] Patent Number: 4,849,985
[45] Date of Patent: Jul. 18, 1989

[54] DISTRIBUTED FEEDBACK SEMICONDUCTOR LASER DEVICE

[75] Inventors: Toshihiko Yoshida, Tenri; Haruhisa Takiguchi; Shinji Kaneiwa, both of Nara; Hiroaki Kudo, Tenri, all of Japan

[73] Assignee: Sharp Kabushiki Kaisha, Osaka, Japan

[21] Appl. No.: 104,315

[22] Filed: Oct. 2, 1987

[30] Foreign Application Priority Data

Oct. 8, 1986 [JP] Japan .................................. 61-239480

[51] Int. Cl.$^4$ .............................................. H01S 3/19
[52] U.S. Cl. ........................................ 372/96; 372/33; 372/44
[58] Field of Search ..................... 372/96, 92, 108, 33, 372/49, 43, 44

[56] References Cited

FOREIGN PATENT DOCUMENTS 52-86786  7/1977  Japan .
0137388   6/1986  Japan ..................................... 372/43
1010241  11/1965  United Kingdom .

OTHER PUBLICATIONS

Nippon Denki K.K. (1985) Patent Abstracts of Japan 9 (173), E-329, 1896.
Hsieh et al., (1980) IEEE Journal of Quantum Electronics QE-16(10):1039–1044; "Liquid-Phase . . . Tuning Range".
Salzman et al., (1985) Appl. Phys. Lett. 47(1):9–11; "Tilted-Mirror Semiconductor Lasers".
Kokusai Denshin Denwa K.K. (1983) Patent Abstracts of Japan 7(84), E-169, 1229.
Tokyo Shibaura Denki K.K. (1977) Patent Abstracts of Japan 1(146):7554.

Primary Examiner—William L. Sikes
Assistant Examiner—Xuân Thi Vo
Attorney, Agent, or Firm—Irell & Manella

[57] ABSTRACT

A distributed feedback semiconductor laser device comprising a laser oscillation region and a distributed reflector which are provided in a laminated crystal structure, and comprising facets at both the ends, wherein a light emitting face is disposed at one or both ends of the laser oscillation region, the face being parallel to the lamination direction and intersecting with the light emitting direction at an angle which is 90 degrees minus the Bresster angle.

3 Claims, 2 Drawing Sheets

DISTRIBUTED FEEDBACK SEMICONDUCTOR LASER DEVICE

BACKGROUND OF THE INVENTION

1. Field of the invention

This invention relates to a distributed feedback semiconductor laser device having a distributed reflector in a laminated crystal structure.

2. Description of the prior art

A distributed feedback semiconductor laser device, in which the refractive index or the absorption coefficient is changed at the same periodicity as the wavelength of the laser beam in the direction of the propagation of the laser beam, can easily achieve laser oscillation in a single longitudinal mode, and does not discontinuously change its oscillating wavelength even when the temperature or the excitation current level is changed rapidly. Accordingly, such a device is very useful as a light source of an optical communication system or optical measuring system.

In such a distributed feedback semiconductor laser device, it is critically important to prevent laser oscillation in a Fabry-Perot resonator mode. In other words, such a device must be constructed so that the cleavage facets of both the ends do not constitute a Fabry-Perot resonator. It has been proposed to provide such a construction by processing physically or chemically one or both of the ends of the device to be corrugated, or by forming one or both of the ends to be slanted so as not to be perpendicular to the growth surface of the laminated crystal structure (for example, OQE83-100, Vol. 83, No. 251, p57-64, Jan. 25, 1984, and Japanese Laid Open Patent Publication No. 52-86786).

In a semiconductor laser device having such a construction, however, the laser beam is scattered or reflected into a direction other than the light emitting direction at the facets to prevent oscillation in a Fabry-Perot resonator mode, thereby causing a significant loss, lowering the gain of the device. Hence, a distributed feedback semiconductor laser generally has a lower differential efficiency than that of a conventional semiconductor laser having a Fabry-Perot resonator.

In order to eliminate such a loss caused at the facets, it has been proposed that one of the facets be coated by dielectric layers so as to provide a lower reflectivity and the other facet be coated so as to provide a higher reflectivity. However, this technique also has drawbacks in that it is difficult to produce a laser beam output for monitoring and that the yield of high quality devices is very poor because one of the facets must be coated by five or more dielectric layers to provide the lower reflectivity.

SUMMARY OF THE INVENTION

The distributed feedback semiconductor laser device of this invention, which overcomes the above-discussed and numerous other disadvantages and deficiencies of the prior art, comprises a laser oscillation region and a distributed reflector which are provided in a laminated crystal structure, and comprising facets at both the ends, wherein a light emitting face is disposed at one or both ends of the laser oscillation region, the face being parallel to the lamination direction and intersecting with the light emitting direction at an angle which is 90 degrees minus the Brewster angle.

In a preferred embodiment, the face is disposed inward from the corresponding one of the facets.

In a preferred embodiment, the width of the face is greater than the width of the laser oscillation region.

Thus, the invention described herein makes possible the objects of (1) providing a distributed feedback semiconductor laser device which attains laser oscillation in a distributed feedback mode without impairing the differential efficiency; (2) providing a distributed feedback semiconductor laser device of high quality which can be manufactured with a high yield; (3) providing a distributed feedback semiconductor laser device in which laser oscillation in a Fabry-Perot resonator mode can be effectively prevented without corrugating, slanting or coating the facets; (4) providing a distributed feedback semiconductor laser device which will not produce a substantial loss at the facets; and (5) providing a distributed feedback semiconductor laser device which can be manufactured easily.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT (Example)

Figure 1:
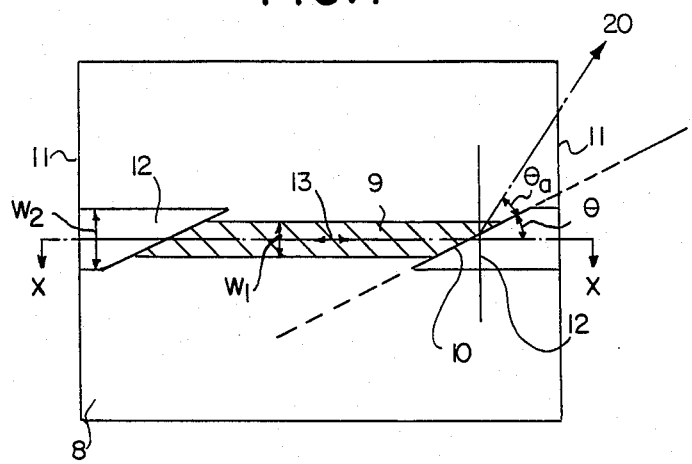
FIG. 1 is a plan view showing a distributed feedback semiconductor laser device of this invention.
Figure 2:
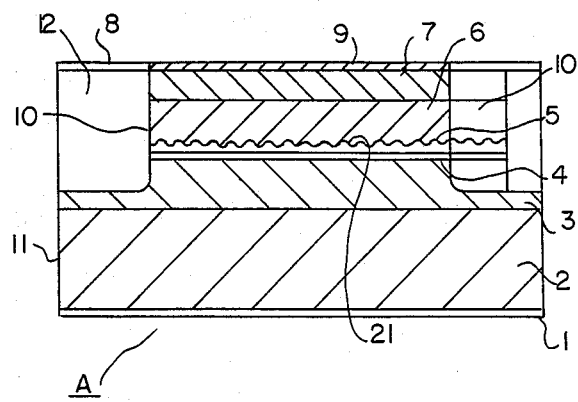
FIG. 2 is a cross sectional view taken along the line X—X of FIG. 1.

FIG. 1 shows a distributed feedback semiconductor laser device of this invention which, as shown in FIG. 2, comprises an n-InP substrate 2, an n-side electrode 1 formed on the under face of the substrate 2, and a laminated crystal structure grown on the (100) face of the substrate 2. The laminated crystal structure comprises an n-InP buffer layer 3, an undoped InGaAsP active layer 4, a p-InGaAsP optical guiding layer 5 which has a greater energy band gap than that of the active layer 4 and on which a distributed reflector 21 is formed, a p-InP cladding layer 6, a p-InGaAsP contacting layer 7, an $Si_3N_4$ film 8, and a p-side electrode 9 formed on the contacting layer 7.

The distributed feedback semiconductor laser device A has two faces 10 which are positioned at the both ends of the oscillating cavity, respectively. The faces 10 are one wall of recesses 10 which are formed at the end facets 11, respectively. The width $W_2$ of the recesses 12 is twice the width $W_1$ of the electrode 9. The recesses 12 have an opening which opens at the top of the device A and has a trapezoid shape in a plan view. The top of the faces 10 corresponds to the oblique side of the trapezoid. The faces 10 are formed so that they are perpendicular to the (100) face of the double heterostructure of the device A and form a predetermined angle $\theta$ with the laser beam emitting direction which is shown by a double-pointed arrow 13 in FIG. 1.

The angle $\theta$ is selected so as to satisfy the following Equation (1):

$$\tan(90° - \theta) = n \qquad (1)$$

where n is the refractive index for the wavelength of the laser beam of the medium through which the laser beam propagates. The tangent of the Brewster angle $\alpha$ is equal to the refractive index n, i.e.;

$$\tan \alpha = n \quad (2)$$

Substituting the Equation (2) into the Equation (1), the angle $\theta$ can be expressed as follows:

$$\theta = 90° - \alpha \quad (3)$$

In a preferred embodiment, the angle $\theta$ is selected to be within the range of 70° to 80°.

In the device of the example, the electric field of the laser beam is parallel to the (100) face. Hence, the polarization direction is also parallel to the (100) face, resulting in the laser beam entering the faces 10 at the Brewster angle and not being substantially reflected. Generally, a portion of the laser beam has an electric field which is perpendicular to the (100) face. The faces 10 act as highly reflective faces so that, when this portion of the laser beam is incident on the faces 10, it is reflected into the direction 20 forming an angle of $2 \times (90° - \theta)$ with the propagation direction of the laser beam; namely namely, the reflected laser beam forms an angle $\theta_a$ with respect to the face 10, where $\theta_a = \theta$. Therefore this portion of the laser beam is not included in the laser beam emitted from the faces 10, resulting in an improved degree of polarization of the device A.

The distributed feedback semiconductor laser device A having the above-mentioned structure is manufactured as follows: On the (100) face of the substrate 2, the n-buffer layer 3, the active layer 4, and the p-optical guiding layer 5 are successively grown by a conventional liquid phase epitaxial growth method. The surface of the layer 5 is coated with a photo-resist to form a photo-resist film, which is then subjected to a conventional two-beam interference exposure treatment, resulting in a grating pattern of the photo-resist film. Using the resulting photo-resist film as a mask, grooves having the substantially same period as that of the laser beam along the direction of the laser beam propagation are formed on the optical guiding layer 5 by a chemical etching technique in which a mixture solution of saturated bromine water, phosphoric acid and water (2:1:15) is used as an etchant. The obtained diffraction grating 21 constitutes a distributed reflector. Thereafter, a second liquid phase epitaxial growth is conducted to successively grow the p-InP cladding layer 6 and the p-InGaAsP contacting layer 7 on the diffraction grating 21. On the contacting layer 7, $Si_3N_4$ is then deposited by an appropriate method such as a plasma CVD to form the $Si_3N_4$ film 8.

Figure 3:
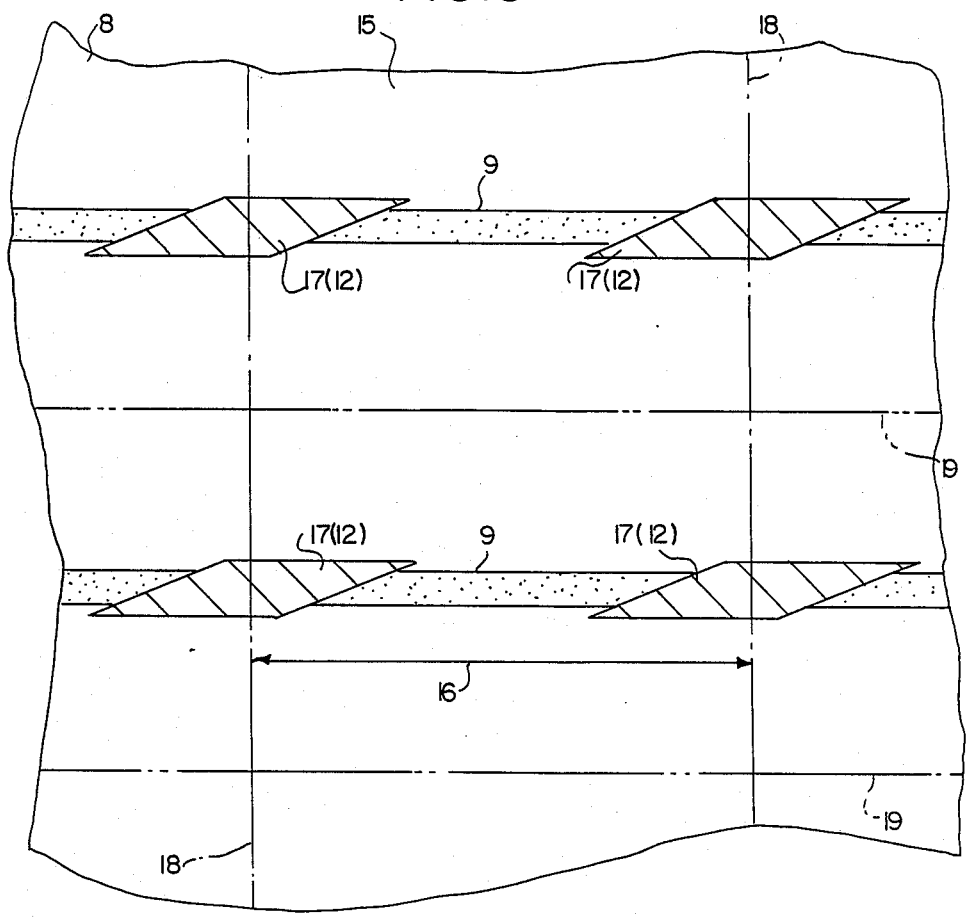
FIG. 3 is a plan view of a portion of a wafer for illustrating the method of manufacturing the device shown in FIG. 1.

FIG. 3 shows a wafer 15 on which the above mentioned processes have been conducted to form a plurality of the lamination structures. Some areas of the $Si_3N_4$ film 8 on the wafer 15 are etched away by a conventional photolithographic technique to form an array of windows 17 in the film 8. Each of the windows 17 is shaped into a parallelogram in a plan view and positioned so that their pitch in the direction of the laser beam propagation corresponds to the distance between the facets 11 (FIG. 1) which will be formed later. Thereafter, the wafer 15 is subjected to reactive ion beam etching, using the $Si_3N_4$ film 8 having windows 17 as a mask, to form recess portions 12 (FIGS. 1 and 2) which have a parallelogram shape in a plan view and reach the n-buffer layer 3. Then, the stripe areas of the $Si_3N_4$ film 8 between two corresponding etched portions 12 are removed by etching, followed by the deposition of the stripe electrodes 9 in the stripe etched areas. The wafer 15 is then cut along the one-dot chain lines 18 and the two-dot chain lines 19 into individual laser devices A.

Although the above-mentioned example discloses only an InGaAsP/InP striped electrode semiconductor laser device, it is not limited thereto. Other semiconductor laser devices comprising other materials such as GaAlAs/GaAs, and InGaP/InGaAlP can be applied. Further, the present invention can be applied to semiconductor laser devices having other structures such as a buried structure.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a distributed feedback semiconductor laser device comprising a laser oscillation region and a distributed reflector which are provided in a laminated crystal structure having substantially parallel layers and having two ends, and comprising facets at both the ends, a light emitting face disposed at one or both ends of the laser oscillation region, said face being substantially perpendicular to said layers and inclined to the light emitting direction at an angle which is 90 degrees minus the Brewster angle.

2. An apparatus according to claim 1, wherein said layers have ends defining two facets, and wherein said face is disposed between said facets.

3. An apparatus according to claim 1, wherein the width of said face is greater than the width of said laser oscillation region.